(12) United States Patent
Isobata

(10) Patent No.: US 12,466,681 B2
(45) Date of Patent: *Nov. 11, 2025

(54) CARRIER TAPE HOLDING DEVICE, HOLDER, AND CARRIER TAPE PACKAGE BODY

(71) Applicant: Panasonic Intellectual Property Management Co., Ltd., Osaka (JP)

(72) Inventor: Yoshinori Isobata, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 14 days.

This patent is subject to a terminal disclaimer.

(21) Appl. No.: 18/654,050

(22) Filed: May 3, 2024

(65) Prior Publication Data

US 2024/0279015 A1 Aug. 22, 2024

Related U.S. Application Data

(63) Continuation of application No. 17/440,228, filed as application No. PCT/JP2020/002663 on Jan. 27, 2020, now Pat. No. 12,006,175.

(30) Foreign Application Priority Data

Mar. 29, 2019 (JP) ................ 2019-065593

(51) Int. Cl.
*H05K 13/02* (2006.01)
*B65H 16/02* (2006.01)
(Continued)

(52) U.S. Cl.
CPC ........... *B65H 19/18* (2013.01); *B65H 16/021* (2013.01); *B65H 16/06* (2013.01); *B65H 75/16* (2013.01); *H05K 13/02* (2013.01)

(58) Field of Classification Search
CPC .. H05K 13/02; H05K 13/021; H05K 13/0417; B65H 19/18; B65H 16/021;
(Continued)

(56) References Cited

U.S. PATENT DOCUMENTS 5,979,045 A 11/1999 Nishimori et al.
10,159,170 B2 12/2018 Ohashi et al.
(Continued)

FOREIGN PATENT DOCUMENTS

CN 104429175 A 3/2015
CN 107950083 A 4/2018
(Continued)

OTHER PUBLICATIONS

International Search Report of PCT application No. PCT/JP2020/002663 dated Apr. 14, 2020.
(Continued)

*Primary Examiner* — Sang K Kim
(74) *Attorney, Agent, or Firm* — McDonald Hopkins LLC

(57) ABSTRACT

A component mounting device comprises a mounting head being configured to mount a component from a carrier tape onto a substrate, a component supply unit being configured to convey the carrier tape, a holder, and a carrier tape holding device providing a first storage space in communication with the holder. The carrier tape holding device is configured to perform operations comprising: holding the carrier tape that, when conveyed by the component supply unit, is pulled out from a tape roll body stored in the first storage space, having a tape roll body for replenishment stored in the holder; and receiving the tape roll body for replenishment from the holder when the carrier tape of the tape roll body for replenishment is conveyed by the component supply unit.

5 Claims, 19 Drawing Sheets

(51) Int. Cl.
    *B65H 16/06*     (2006.01)
    *B65H 19/18*     (2006.01)
    *B65H 75/16*     (2006.01)

(58) Field of Classification Search
    CPC ........ B65H 16/06; B65H 75/16; B65H 49/20;
                            B65H 49/322; B65H 49/328
    See application file for complete search history.

(56) References Cited

U.S. PATENT DOCUMENTS

| | | | |
|---|---|---|---|
| 10,212,868 | B2 | 2/2019 | Ohashi et al. |
| 12,006,175 | B2 * | 6/2024 | Isobata ................. B65H 19/18 |
| 2015/0115093 | A1 | 4/2015 | Tanokuchi et al. |
| 2017/0354070 | A1 | 12/2017 | Kobayashi et al. |
| 2018/0084684 | A1 | 3/2018 | Ohashi et al. |
| 2018/0184554 | A1 | 6/2018 | Ikeda et al. |
| 2018/0303014 | A1 | 10/2018 | Taniguchi |
| 2019/0269049 | A1 | 8/2019 | Iwasaki |
| 2020/0214182 | A1 | 7/2020 | Motowaki |

FOREIGN PATENT DOCUMENTS

| | | |
|---|---|---|
| CN | 108141997 A | 6/2018 |
| CN | 109156097 A | 1/2019 |
| JP | H05-021990 A | 1/1993 |
| JP | 2014-011216 A | 1/2014 |
| JP | 2017-216379 A | 12/2017 |
| JP | 2020-107680 A | 7/2020 |
| WO | 2013/136423 A1 | 9/2013 |
| WO | 2017/042901 A1 | 3/2017 |
| WO | 2017/061043 A1 | 4/2017 |
| WO | 2018/070024 A1 | 4/2018 |

OTHER PUBLICATIONS

English Translation of Chinese Search Report dated Feb. 22, 2023 for the related Chinese Patent Application No. 202080024609.6.
English Translation of Chinese Search Report dated Apr. 14, 2023 for the related Chinese Patent Application No. 202210292717.2.
English Translation of Chinese Search Report dated Apr. 18, 2023 for the related Chinese Patent Application No. 202210292239.5.
English Translation of Chinese Search Report dated Apr. 19, 2023 for the related Chinese Patent Application No. 202210292831.5.

* cited by examiner

REGION AR

CARRIER TAPE HOLDING DEVICE, HOLDER, AND CARRIER TAPE PACKAGE BODY

CROSS-REFERENCE TO RELATED APPLICATIONS

This is a continuation of U.S. patent application Ser. No. 17/440,228 filed on Sep. 17, 2021, which is the National Stage of International Application No. PCT/JP2020/002663 filed on Jan. 27, 2020, which claims the benefit of foreign priority of Japanese patent application No. 2019-065593 filed on Mar. 29, 2019, the contents all of which are incorporated herein by reference.

TECHNICAL FIELD

The present invention relates to a carrier tape holding device installed in a component supply unit that supplies a component by drawing a carrier tape storing the component from a tape roll body formed by winding the carrier tape in a roll shape. The present invention further relates to a holder and a carrier tape package body used by being mounted on the carrier tape holding device.

BACKGROUND ART

Conventionally, as a component supply unit in a component mounting device for mounting a component on a substrate, a type of unit that supplies a component to a component extraction position by conveying a carrier tape storing the component is known. The carrier tape is wound around a winding core of a reel that is a tape holder. The carrier tape is transported, stored, and set on the component supply unit, for example, while being wound around the reel.

Additionally, it has also been proposed to eliminate the tape holder such as a reel, and transport, store, and set the carrier tape on a component supply unit, for example, when the carrier tape is wound in a roll shape to form a tape roll body (e.g., PTL 1). In PTL 1, a tape roll body of a carrier tape is charged into a storage portion of a component supply unit from a component replenishing device. Additionally, after the component supply unit finishes pulling out the carrier tape from the tape roll body, no tape holder such as a reel remains. PTL 1 uses this fact to automate component supply.

CITATION LIST

Patent Literature

PTL 1: Unexamined Japanese Patent Publication No. H5-21990

SUMMARY OF THE INVENTION

However, in the above Patent Literature, a large-scale device for supplying the tape roll body of the carrier tape to the component supply unit is required.

The present invention provides a carrier tape holding device, a holder, and a carrier tape package body capable of replenishing a component supply unit with components with a simple and inexpensive configuration.

The carrier tape holding device of the present invention is installed in a component supply unit that supplies a component by drawing a carrier tape storing the component from a tape roll body formed by winding the carrier tape in a roll shape. The carrier tape holding device includes a storage portion and a holder mounting portion. The storage portion is provided with a storage space for storing the tape roll body, and one portion of the storage space is opened. The holder mounting portion is provided with a holder is detachably mounted, the holder holding a tape roll body for replenishment to be used next to the tape roll body. The storage portion stores the tape roll body in a state where the component supply unit can draw the carrier tape from the tape roll body. Additionally, the storage portion is configured to receive, into the storage space from the open portion of the storage space, the tape roll body for replenishment moving out of the holder mounted on the holder mounting portion.

The holder of the present invention is used to supply a tape roll body for replenishment to a carrier tape holding device that is installed in a component supply unit that supplies a component by drawing a carrier tape storing the component from a tape roll body formed by winding the carrier tape in a roll shape, and has a storage portion storing the tape roll body. The holder includes a holding portion and a mounting portion. The holding portion includes a replenishment storage space and an opening, the replenishment storage space being for storing the tape roll body for replenishment, and the opening being for taking in and out the tape roll body for replenishment to and from the replenishment storage space. The mounting portion is mounted on a holder mounting portion of the carrier tape holding device with an opening facing the storage portion of the carrier tape holding device.

A carrier tape package body of the present invention has a tape roll body for replenishment, the above holder, and a package member. The tape roll body for replenishment is formed by winding a carrier tape storing a component in a roll shape. The package member packages the holder storing the tape roll body for replenishment.

According to the present invention, a component supply unit can be replenished with components with a simple and inexpensive configuration.

DESCRIPTION OF EMBODIMENT

Figure 1:
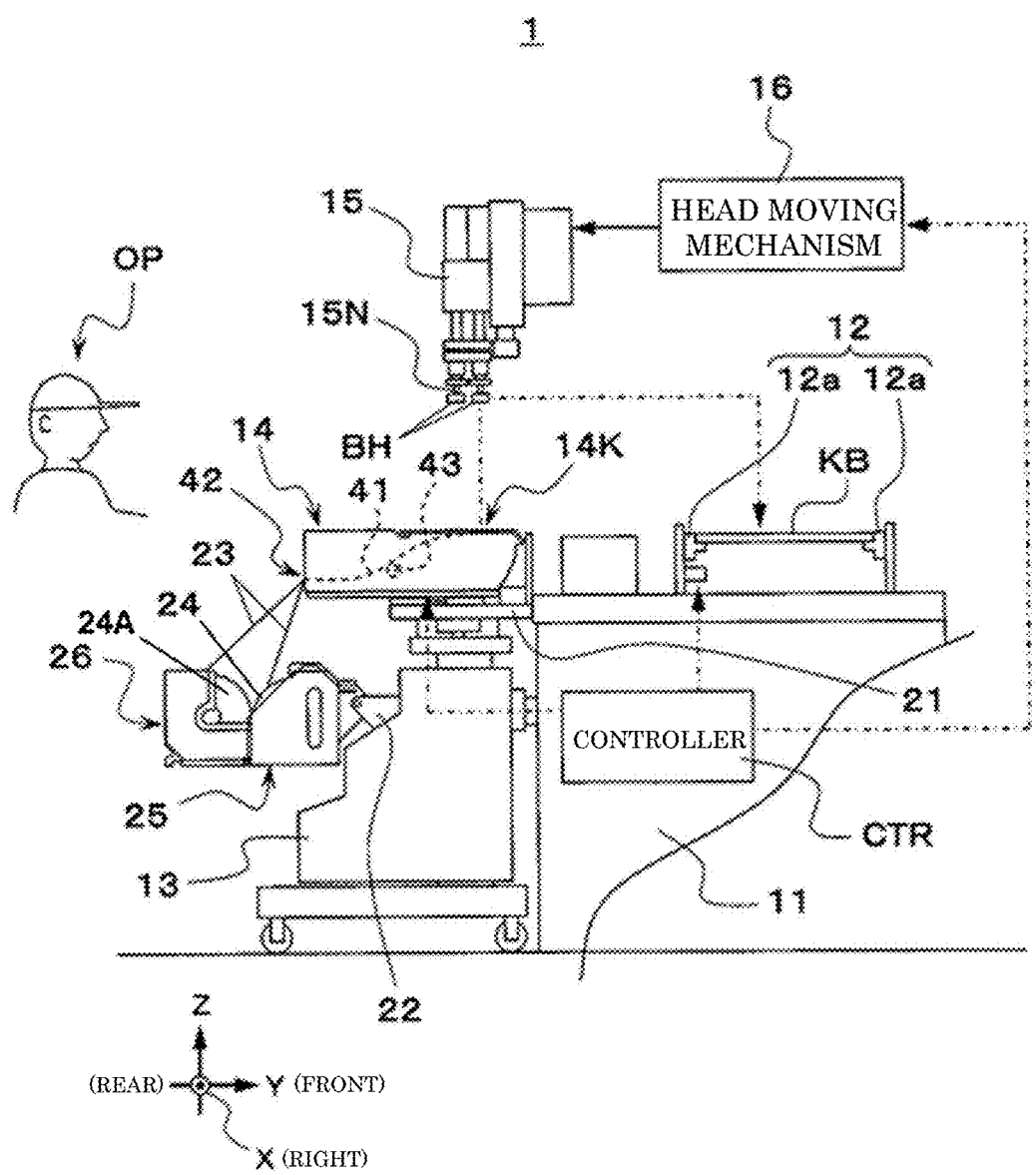
FIG. 1 is a side view of a main part of a component mounting device including a carrier tape holding device of an exemplary embodiment of the present invention.

Hereinafter, an exemplary embodiment of the present invention will be described with reference to the drawings. FIG. 1 shows component mounting device 1 including carrier tape holding device 25 of an exemplary embodiment of the present invention. Component mounting device 1 repeatedly performs a series of operations of mounting component BH on substrate KB carried in from an upstream process and carrying out component BH to a downstream process. In the present exemplary embodiment, an axis extending to the left and right of component mounting device 1 as viewed from operator OP is defined as an X axis, and an axis extending to the front and rear of component mounting device 1 as viewed from operator OP is defined as a Y axis. Additionally, an axis extending to upper and lower directions is defined as a Z axis.

Component mounting device 1 has base 11, substrate conveyance unit 12, carriage 13, multiple component supply units 14, mounting head 15, and head moving mechanism 16. Substrate conveyance unit 12 includes a pair of conveyor mechanisms 12a extending along the X axis, conveys substrate KB along the X axis, and positions substrate KB at a predetermined operation position. Carriage 13 is operated to travel on a floor surface by operator OP and is connected to base 11.

Unit attachment base 21 is provided on an upper part of carriage 13. Additionally, in carriage 13, multiple brackets 22 extending so as to protrude rearward (toward operator OP) are provided below unit attachment base 21. Unit attachment base 21 has a shape extending along the X axis. The multiple brackets 22 are provided side by side along the X axis.

The multiple component supply units 14 are provided side by side along the X axis with respect to unit attachment base 21. Each component supply unit 14 is detachably attached to carriage 13. Carrier tape holding device 25 is detachably attached to each bracket 22. Carrier tape holding device 25 stores and holds tape roll body 24. Tape roll body 24 is formed by winding carrier tape 23 enclosing components BH in a roll shape. Holder 26 holding tape roll body for replenishment 24A is detachably attached to carrier tape holding device 25.

In the present exemplary embodiment, holder 26 has a case shape, and stores tape roll body for replenishment 24A formed by winding carrier tape 23 in a roll shape. Carrier tape holding device 25 is installed in component supply unit 14. That is, carrier tape holding device 25 is disposed in a position where component supply unit 14 can draw carrier tape 23 from tape roll body 24 held by carrier tape holding device 25.

Figure 2:
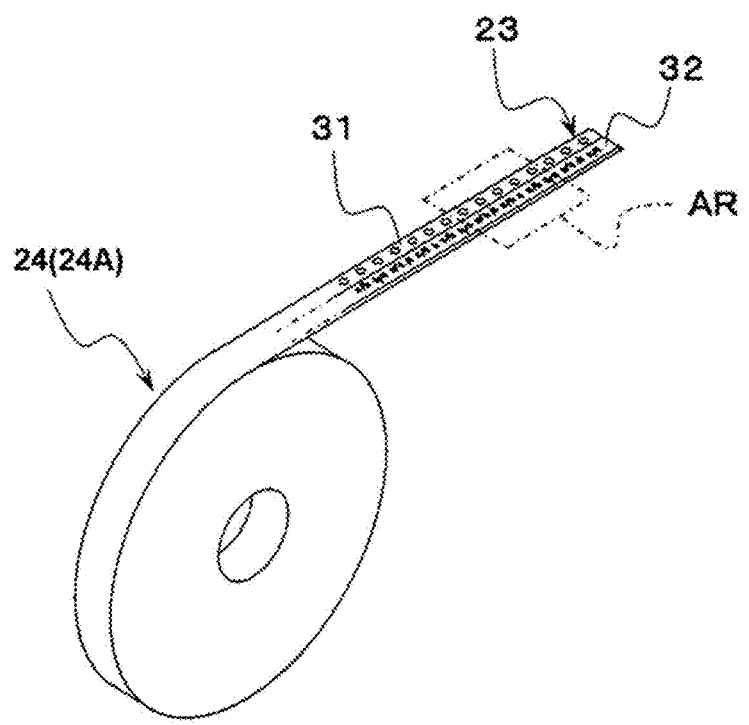
FIG. 2 is a perspective view of a tape roll body of a carrier tape held by the carrier tape holding device of the exemplary embodiment of the present invention.
Figure 3:
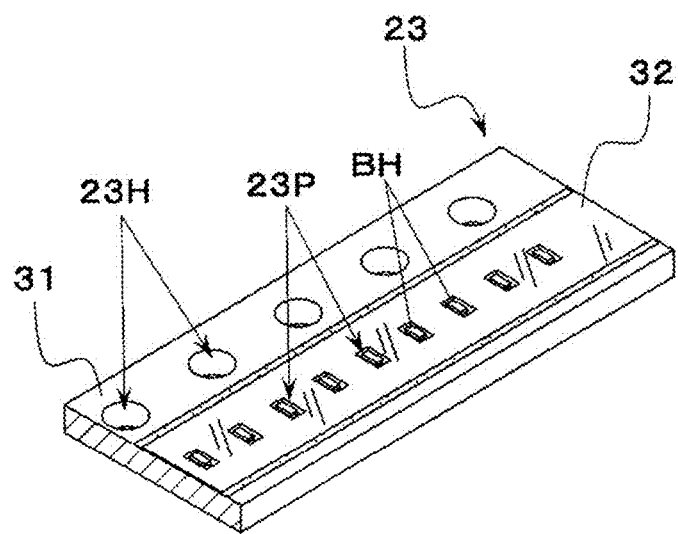
FIG. 3 is an enlarged perspective view of a part of the carrier tape illustrated in FIG. 2.

FIG. 2 is a perspective view of tape roll body 24 held by carrier tape holding device 25. FIG. 3 is an enlarged perspective view of a part of carrier tape 23. Tape roll body 24 is formed by winding carrier tape 23 with no core. Carrier tape 23 has base tape 31 and cover tape 32. Note that FIG. 3 is an enlarged view of region AR in FIG. 2.

As illustrated in FIG. 3, base tape 31 is provided with a large number of pockets 23P opened upward in a line at equal intervals in the longitudinal direction of base tape 31. Component BH is stored in each of the multiple pockets 23P. Cover tape 32 is adhered to an upper surface of base tape 31, and seals component BH in pocket 23P. Multiple engagement holes 23H are provided in a line at equal intervals in positions aligned in parallel with the row of pockets 23P of base tape 31.

In FIG. 1, component supply unit 14 includes therein conveyance path 41 extending from the rear toward the front, and an end portion on the rear side (side close to operator OP) of conveyance path 41 is tape insertion port 42. In the present exemplary embodiment, each component supply unit 14 is an automatic loading type. That is, when the head portion of carrier tape 23 is inserted from tape insertion port 42, an outer peripheral pin of a sprocket (not illustrated) is engaged with engagement hole 23H of the carrier tape 23. Then, carrier tape 23 is drawn in by rotating the sprocket. Further, component BH is supplied to predetermined component extraction position 14K by rotating the sprocket at regular intervals.

When component supply unit 14 finishes feeding an end portion of carrier tape 23 being conveyed, the conveyance of carrier tape 23 is finished. While the conveyance operation of carrier tape 23 (preceding carrier tape 23) is being performed, component supply unit 14 can insert the head portion of carrier tape 23 (succeeding carrier tape 23) for replenishment into tape insertion port 42. As illustrated in FIG. 1, component supply unit 14 includes end portion detection sensor 43 that detects that an end portion of a preceding carrier tape 23 has passed a predetermined position of component supply unit 14. When end portion detection sensor 43 detects passage of an end portion, component supply unit 14 starts drawing the subsequent carrier tape 23, and continues to supply component BH.

As illustrated in FIG. 1, mounting head 15 has multiple nozzles 15N extending downward. Each nozzle 15N can ascend and descend and rotate about the Z axis with respect to mounting head 15. Additionally, mounting head 15 can generate a vacuum suction force that sucks component BH to the lower end of each nozzle 15N. Head moving mechanism 16 moves mounting head 15 in a horizontal plane, and reciprocates mounting head 15 between a region above component supply unit 14 and a region above substrate KB. In this reciprocating movement, mounting head 15 sucks and picks up component BH from component supply unit 14, and mounts component BH in a predetermined position on substrate KB.

As illustrated in FIG. 1, component mounting device 1 has controller CTR. Controller CTR controls the conveyance and positioning operations of substrate KB by substrate conveyance unit 12, and controls the supply operation of component BH to component extraction position 14K by each component supply unit 14. Additionally, controller CTR controls the movement of mounting head 15 by head moving mechanism 16 to control the operation of mounting head 15. Specifically, controller CTR controls the ascending and descending operation of nozzle 15N and the suction operation of component BH by nozzle 15N.

When component BH is mounted on substrate KB by component mounting device 1, first, substrate conveyance unit 12 carries in and positions substrate KB sent from the upstream process. After positioning substrate KB, each component supply unit 14 supplies component BH to component extraction position 14K. Mounting head 15 picks up component BH supplied by each component supply unit 14 by nozzle 15N, and mounts component BH on a predetermined position on substrate KB. In this manner, mounting head 15 functions as a component mounting unit that takes out component BH supplied by component supply unit 14 and mounts component BH on substrate KB. When mounting head 15 mounts all components BH to be mounted on substrate KB, substrate conveyance unit 12 is activated to convey substrate KB to the outside of component mounting device 1.

In the component mounting operation, each component supply unit 14 pulls out carrier tape 23 from tape roll body 24 held by carrier tape holding device 25 installed therein, and conveys carrier tape 23. Then, when carrier tape 23 is completely pulled out to the end from tape roll body 24 held by carrier tape holding device 2/5, carrier tape 23 pulled out from tape roll body for replenishment 24A stored in holder 26 and inserted into tape insertion port 42 is pulled out as the succeeding carrier tape 23, and components BH are continuously supplied.

Figure 4A:
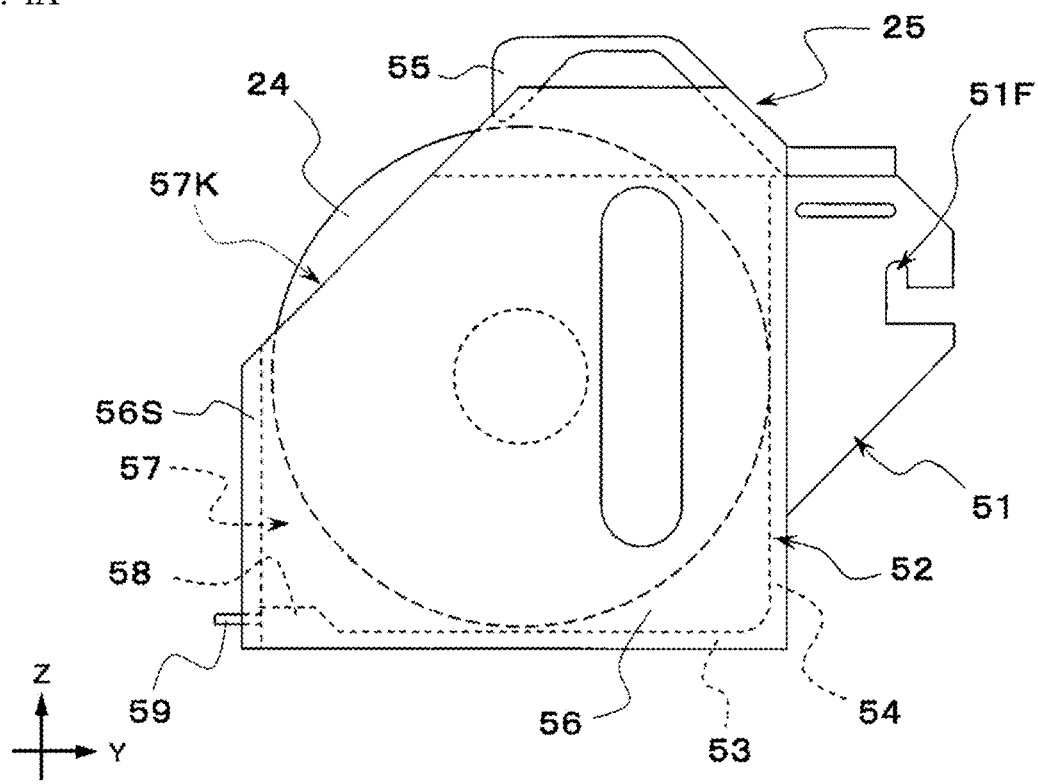
FIG. 4A is a side view illustrating the carrier tape holding device of the exemplary embodiment of the present invention together with a tape roll body stored in the carrier tape holding device.
Figure 4B:
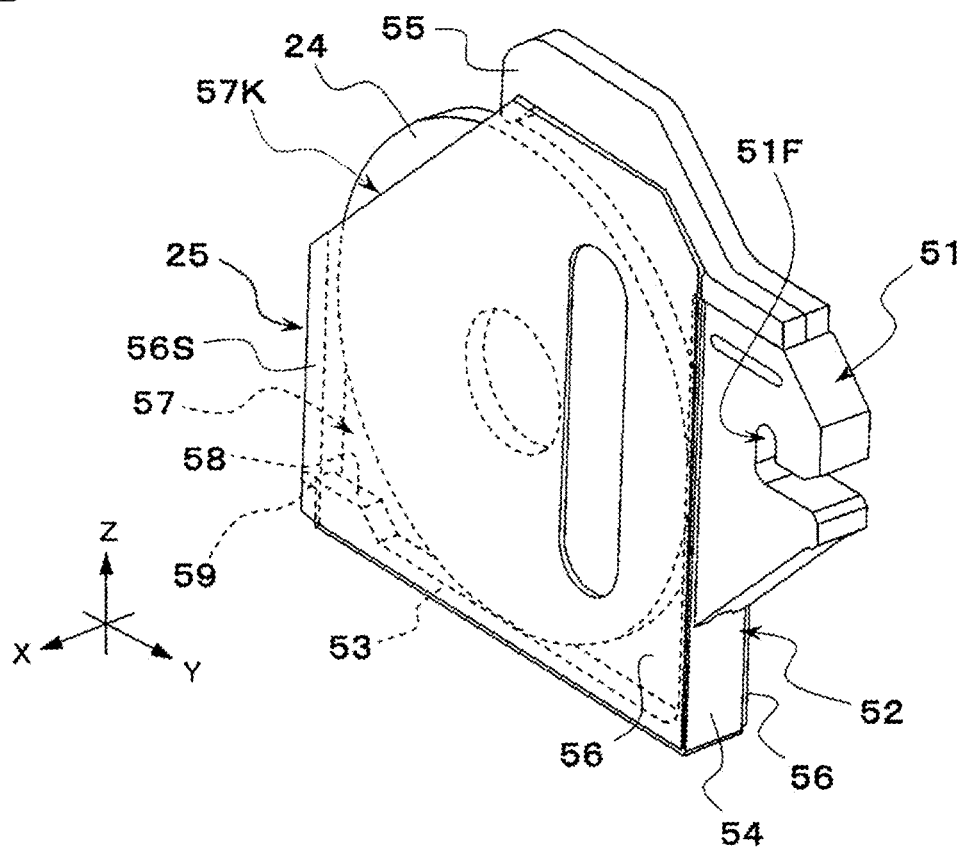
FIG. 4B is a perspective view illustrating the carrier tape holding device and the tape roll body illustrated in FIG. 4A.

FIGS. 4A and 4B are a side view and a perspective view, respectively, illustrating carrier tape holding device 25 and tape roll body 24 stored in carrier tape holding device 25. Carrier tape holding device 25 has coupling portion 51 and storage portion 52. Coupling portion 51 is coupled to bracket 22 of carriage 13, and storage portion 52 stores tape roll body 24.

Storage portion 52 has bottom portion 53, front wall portion 54, upper wall portion 55, and a pair of side wall portions 56. An upper surface of bottom portion 53 extends horizontally. Front wall portion 54 is formed by extending a front end portion of bottom portion 53 upward. Upper wall portion 55 is positioned above bottom portion 53 and is connected to front wall portion 54. Each side wall portion 56 rises from one of both sides of bottom portion 53, and is connected to front wall portion 54 and upper wall portion 55. Storage space 57 is surrounded by bottom portion 53, front wall portion 54, upper wall portion 55, and the pair of side wall portions 56, and has opening 57K opened to the rear and the upper rear to store tape roll body 24. Sill portion 58 which is a slightly high portion is formed in a rear end portion of bottom portion 53, and alignment projection 59 protruding rearward is provided at a rear end of bottom portion 53.

Figure 5:
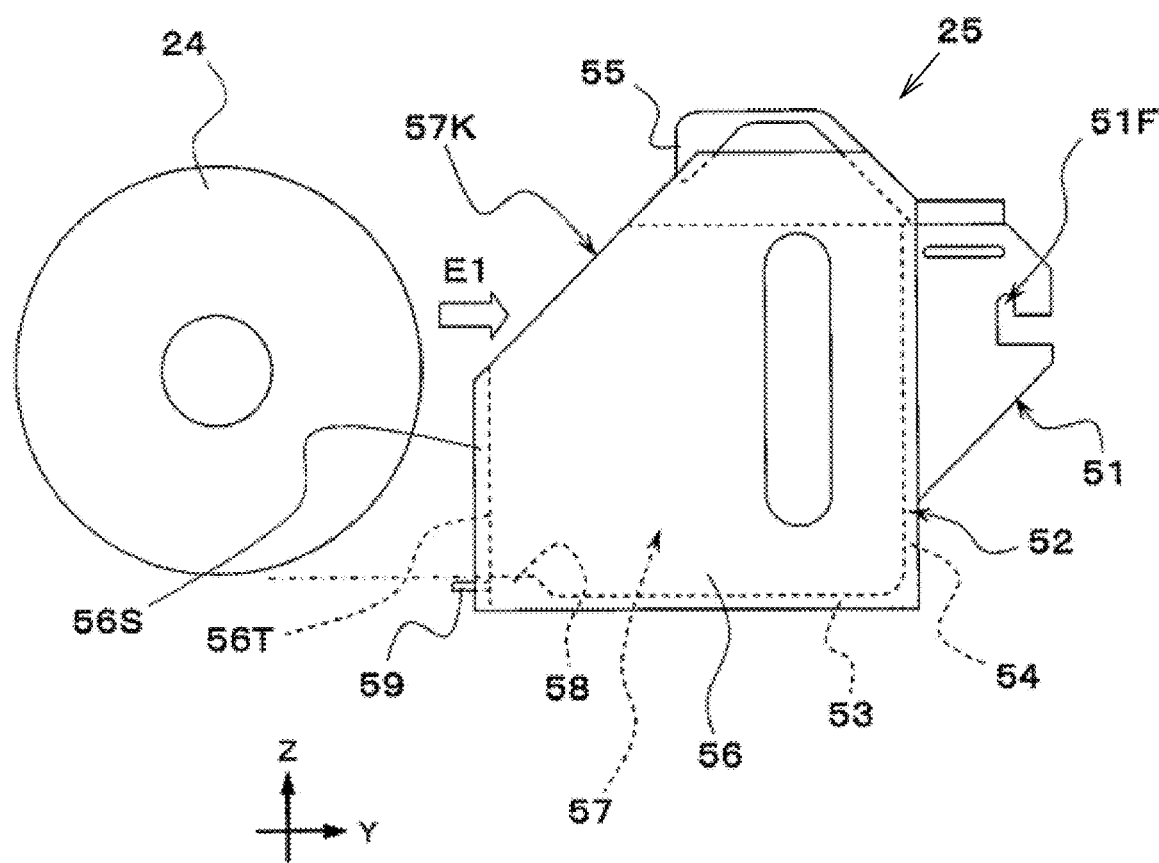
FIG. 5 is a side view illustrating the carrier tape holding device illustrated in FIG. 4A together with a tape roll body stored in the carrier tape holding device.

FIG. 5 is a side view illustrating carrier tape holding device 25 and tape roll body 24 stored in carrier tape holding device 25. Tape roll body 24 can be stored in storage space 57 (i.e., in storage portion 52) by being inserted into storage space 57 as indicated by arrow E1 from opening 57K of storage space 57 of carrier tape holding device 25. Tape roll body 24 stored in storage space 57 is supported by bottom portion 53 as illustrated in FIGS. 4A and 4B. Additionally, front wall portion 54 restricts frontward movement of tape roll body 24. Additionally, sill portion 58 restricts rearward movement of tape roll body 24, and upper wall portion 55 restricts upward movement of tape roll body 24. When carrier tape 23 is pulled out upward from opening 57K in such a state, tape roll body 24 rotates in storage space 57. That is, storage portion 52 allows carrier tape 23 of stored tape roll body 24 to be pulled out by component supply unit 14.

Additionally, when carrier tape 23 is pulled out by component supply unit 14, tape roll body 24 stored in storage space 57 may be lifted up. However, upper wall portion 55 restricts the upward movement of tape roll body 24. That is, upper wall portion 55 functions as a stopper portion that prevents tape roll body 24 from coming out of storage space 57.

Figure 6A:
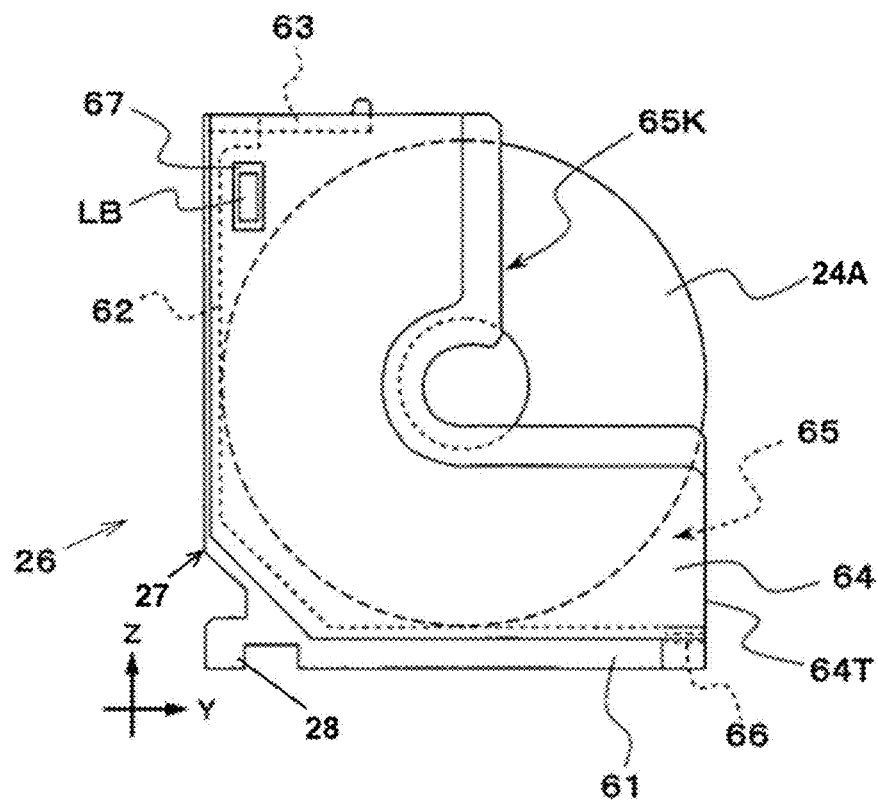
FIG. 6A is a side view illustrating a holder attached to the carrier tape holding device illustrated in FIG. 5 together with a tape roll body for replenishment of a carrier tape stored in the holder.
Figure 6B:
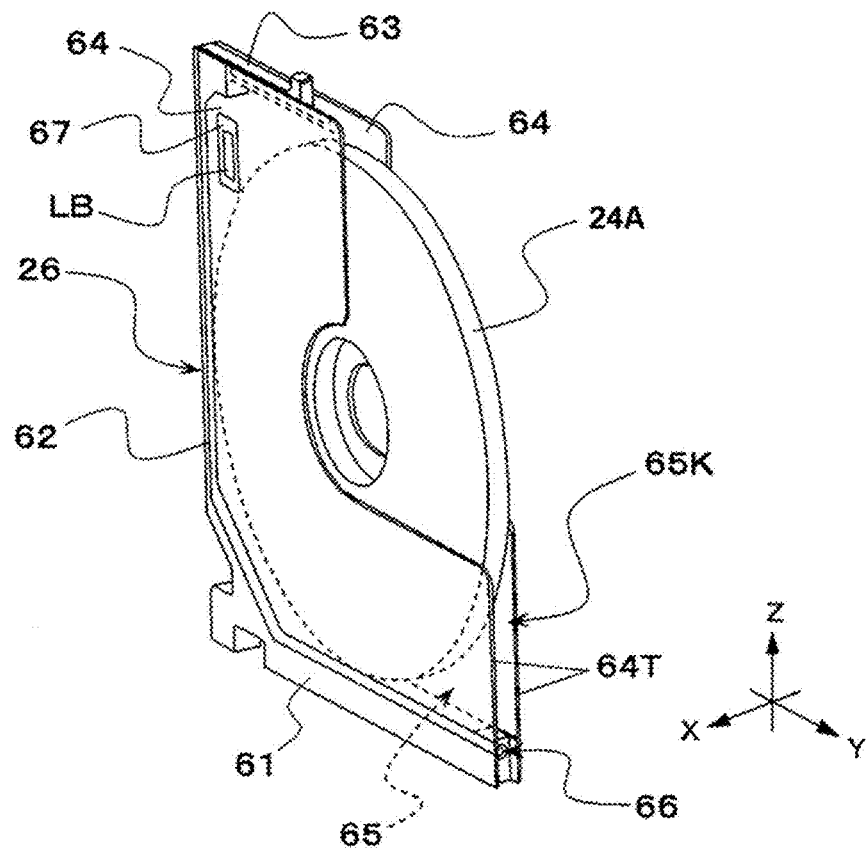
FIG. 6B is a perspective view illustrating the holder and the tape roll body for replenishment illustrated in FIG. 6A.
Figure 7:
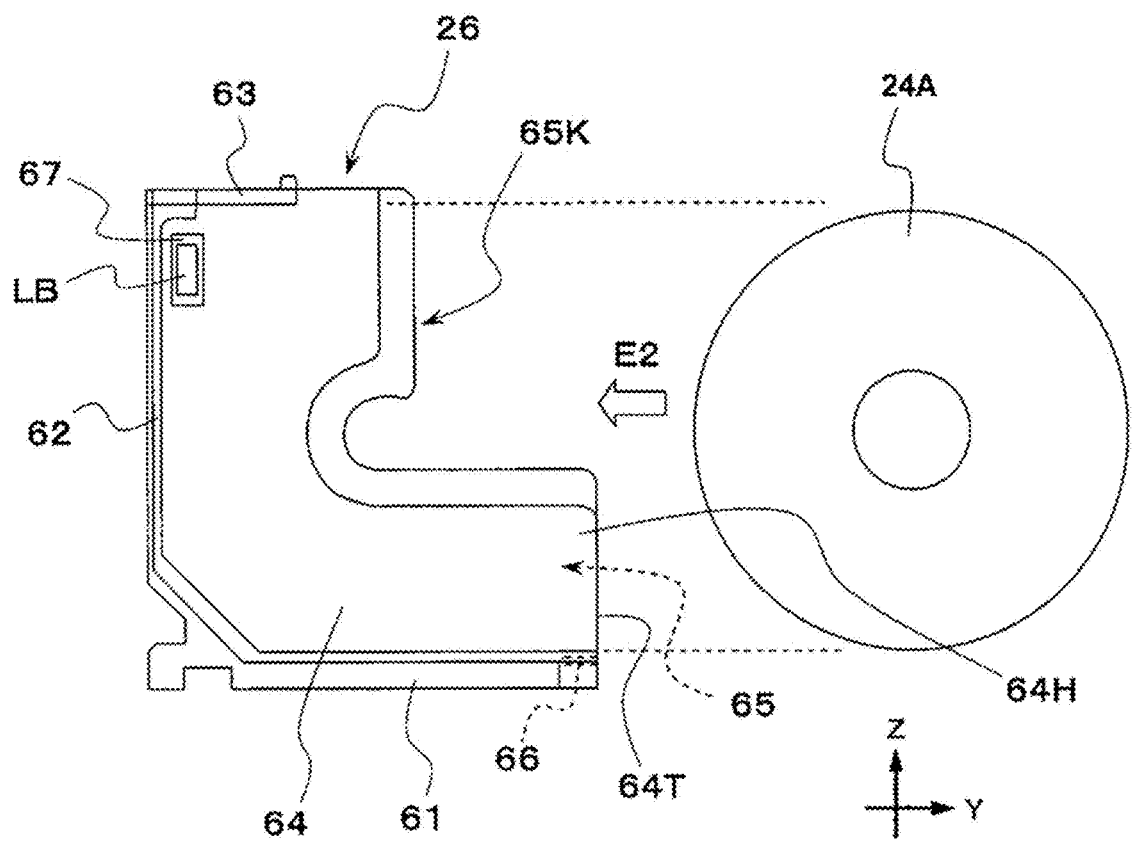
FIG. 7 is a side view illustrating the holder illustrated in FIG. 6A together with a tape roll body stored in the holder.

FIGS. 6A and 6B are a side view and a perspective view, respectively, illustrating holder 26 and tape roll body for replenishment 24A stored in holder 26. FIG. 7 is a side view illustrating holder 26 and tape roll body for replenishment 24A stored in holder 26. Holder 26 has holding portion 27 and mounting portion 64H. Holding portion 27 has bottom portion 61, rear wall portion 62, upper wall portion 63, and a pair of side wall portions 64. Bottom portion 61 supports tape roll body for replenishment 24A from below. Rear wall portion 62 is provided so as to extend upward from a rear end portion of bottom portion 61. Upper wall portion 63 is positioned above bottom portion 61 and is connected to rear wall portion 62. Each side wall portion 64 rises from one of both sides of bottom portion 61, and is connected to rear wall portion 62 and upper wall portion 63.

In FIGS. 6A and 6B, storage space (replenishment storage space) 65 is surrounded by bottom portion 61, rear wall portion 62, upper wall portion 63, and the pair of side wall portions 64. Storage space 65 has opening 65K opened to the front and upper front to take in and out tape roll body 24. Fitting hole 66 into which alignment projection 59 of carrier tape holding device 25 is fitted from the front is provided at the front of bottom portion 61.

Information carrier attachment region 67 is provided on one side wall portion 64. Information carrier LB is attached to information carrier attachment region 67. Here, information carrier LB is a member such as a label holding information on component BH sealed in carrier tape 23 included in tape roll body 24 stored in storage space 65 (or information for accessing the information). Although information carrier LB is originally attached to tape roll body 24, when tape roll body 24 is transferred to holder 26, information carrier LB is separated from tape roll body 24 by operator OP and attached to information carrier attachment region 67. Note that a wireless IC tag holding information regarding component BH sealed in carrier tape 23 (or information for accessing the information) may be used as information carrier LB. Alternatively, when a specific component BH is sealed in carrier tape 23, a two-dimensional code indicating information or the like on component BH may be directly printed in storage space 65 and used as information carrier LB. Examples of the two-dimensional code include a QR code and a barcode.

In FIG. 7, tape roll body for replenishment 24A is stored in storage space 65 by being inserted into storage space 65 from opening 65K of holder 26 as indicated by arrow E2. Bottom portion 61 supports tape roll body for replenishment 24A stored in storage space 65. Rear wall portion 62 restricts rearward movement of tape roll body for replenishment 24A, and upper wall portion 63 restricts upward movement of tape roll body for replenishment 24A. When carrier tape 23 is pulled out frontward and upward from opening 65K in such a state, tape roll body for replenishment 24A rotates in storage space 65. That is, holder 26 allows carrier tape 23 of the stored tape roll body for replenishment 24A to be pulled out by component supply unit 14.

Figure 8:
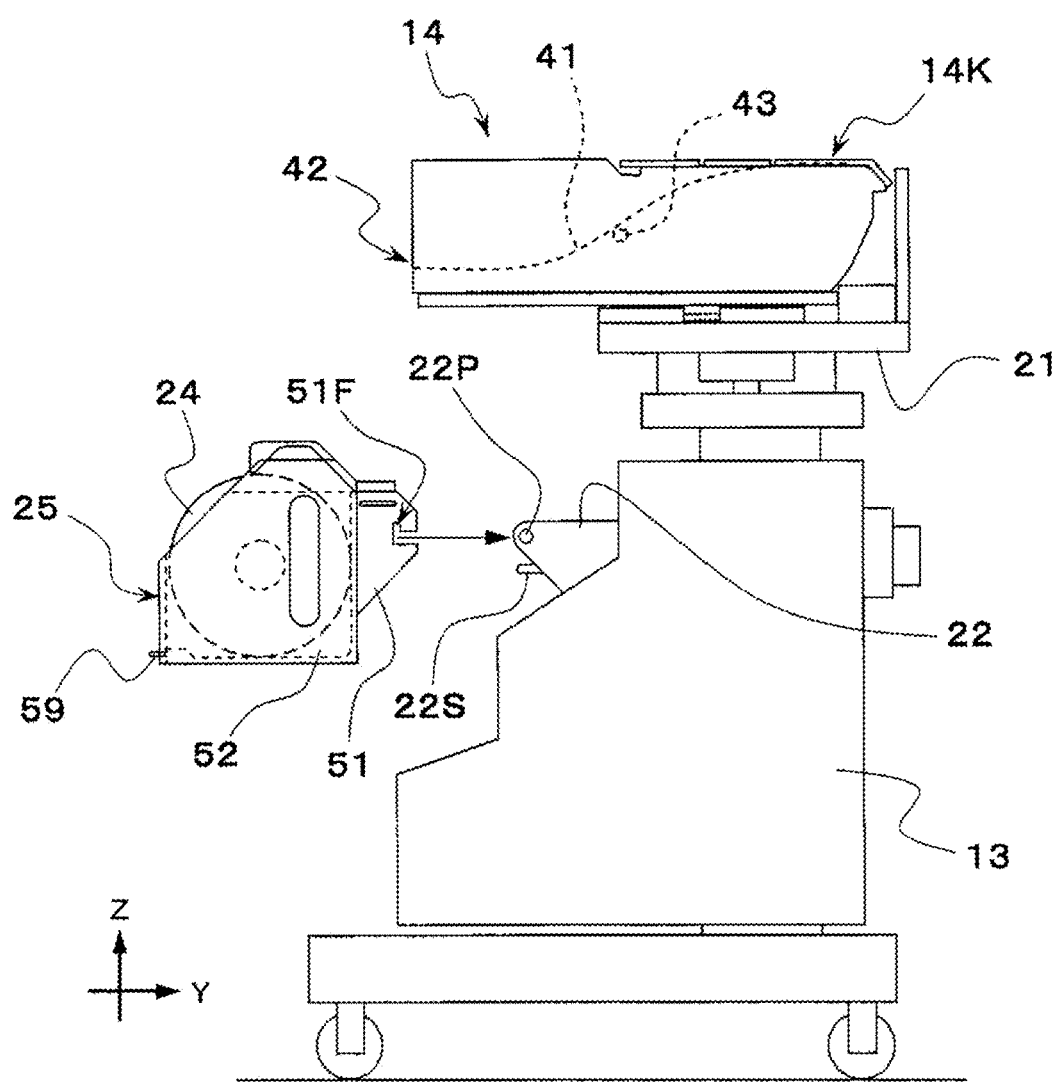
FIG. 8 is a side view illustrating the carrier tape holding device illustrated in FIG. 4A together with a carriage connected to the component mounting device.
Figure 9:
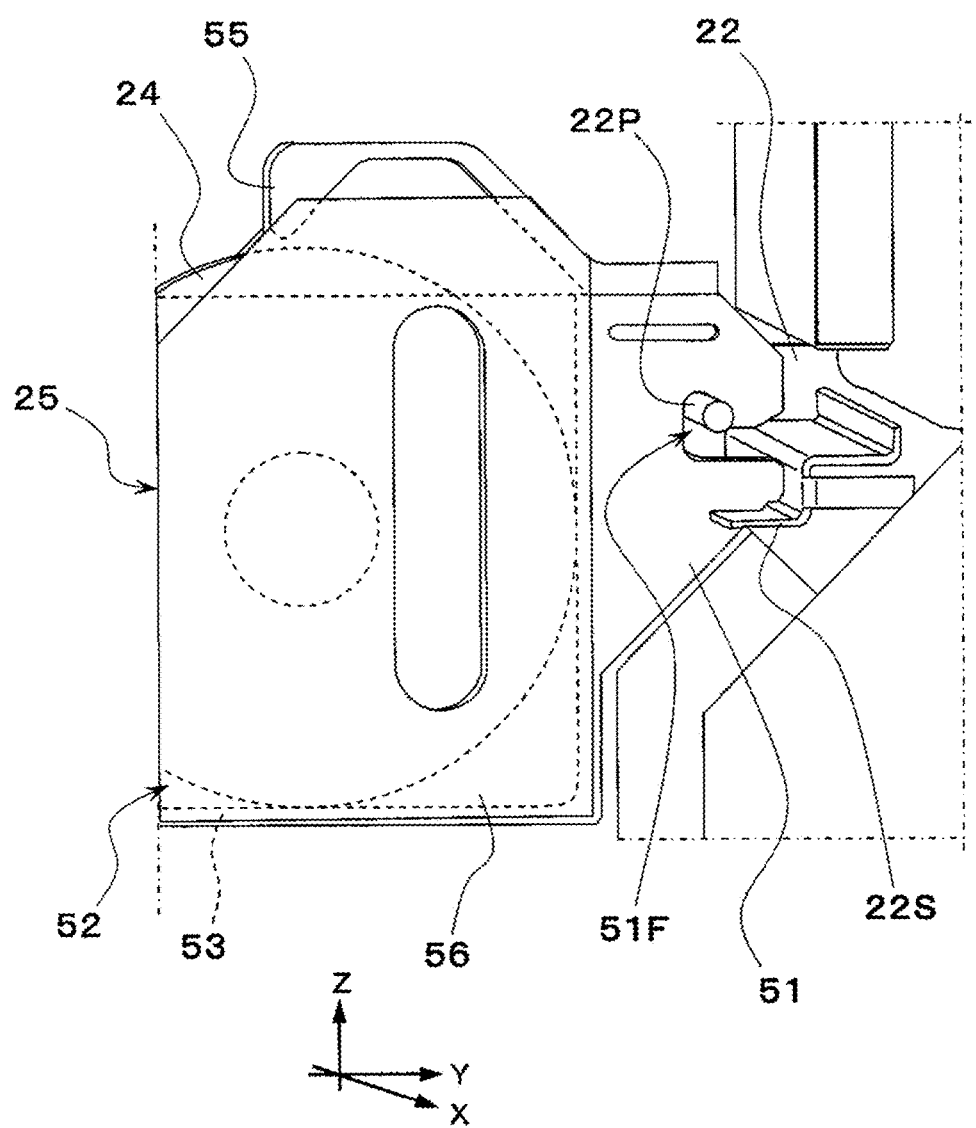
FIG. 9 is a diagram illustrating a state in which the carrier tape holding device illustrated in FIG. 8 is coupled to a bracket of the carriage illustrated in FIG. 8.
Figure 10:
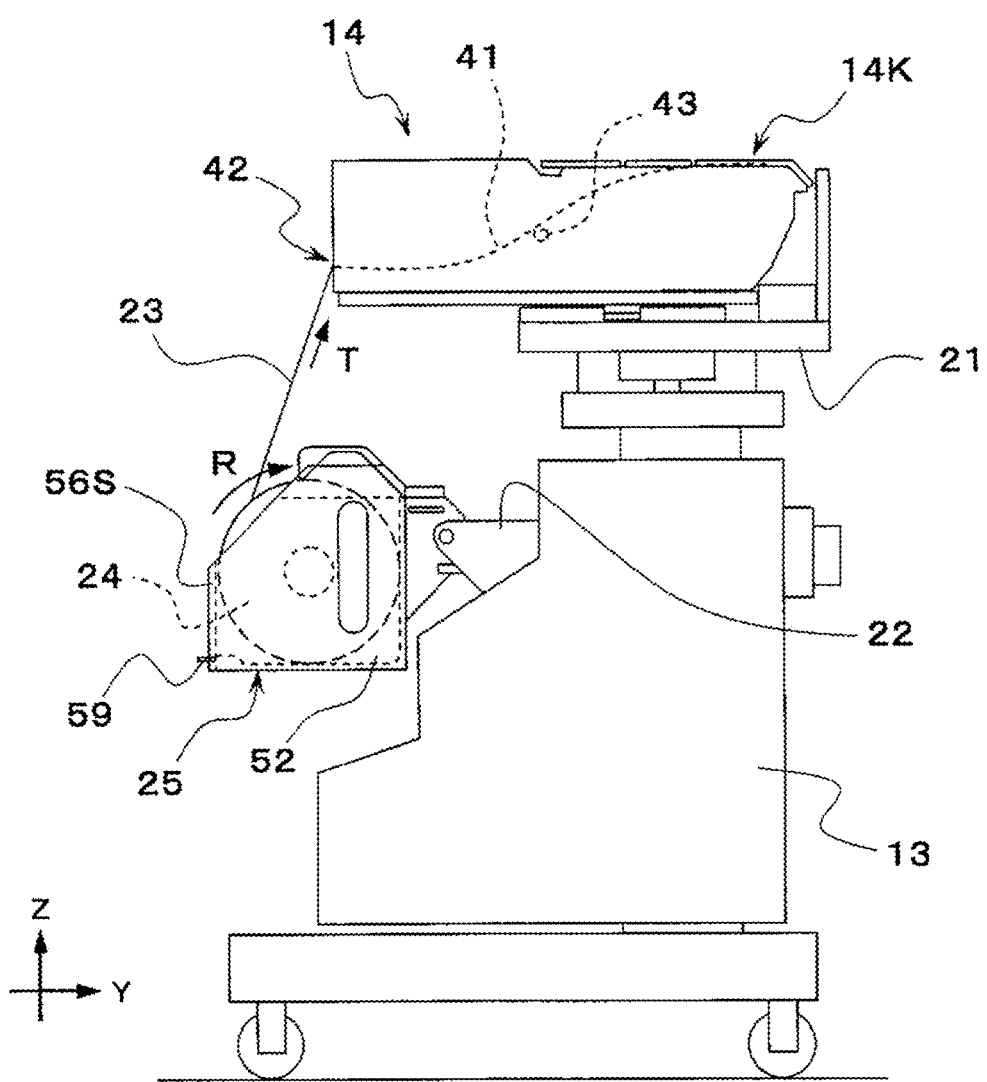
FIG. 10 is a side view illustrating the carrier tape holding device illustrated in FIG. 8 together with the carriage illustrated in FIG. 8.

FIGS. 8 and 10 are side views illustrating carrier tape holding device 25 together with carriage 13 connected to component mounting device 1. FIG. 9 is a diagram illustrating a state in which carrier tape holding device 25 is coupled to bracket 22 of carriage 13. FIGS. 11 and 13 to 17 are side views illustrating carrier tape holding device 25 and holder 26 together with carriage 13 coupled to component mounting device 1. FIGS. 12A and 12B are side views respectively illustrating states before and after carrier tape holding device 25 and holder 26 are coupled to each other. First, the work of operator OP when carrier tape holding device 25 storing tape roll body 24 is attached to carriage 13 will be described.

As illustrated in FIGS. 4A, 4B, and 8, coupling portion 51 of carrier tape holding device 25 is provided with hook portion 51F. Additionally, as illustrated in FIG. 9, bracket 22 is provided with locking pin 22P extending horizontally (along X axis). When carrier tape holding device 25 is attached to carriage 13, operator OP couples coupling portion 51 of carrier tape holding device 25 to bracket 22 of carriage 13 as illustrated in FIG. 8. At this time, as illustrated in FIG. 9, after hooking hook portion 51F onto locking pin 22P from above, operator OP brings a front portion of coupling portion 51 into contact with detent 22S provided on bracket 22.

When carrier tape holding device 25 is attached to carriage 13, operator OP pulls out carrier tape 23 from tape roll body 24 stored in storage portion 52 of carrier tape holding device 25. Then, operator OP inserts the head portion of carrier tape 23 into tape insertion port 42 of component supply unit 14. Component supply unit 14 draws carrier tape 23 and starts the supply operation of component BH.

When component supply unit 14 draws carrier tape 23, tension T acts on carrier tape 23 as indicated by arrow T in FIG. 10. Tape roll body 24 rotates as indicated by arrow R by tension T. Tape roll body 24 is rotated and pulled upward by tension T of carrier tape 23. However, since the pulled up tape roll body 24 abuts on upper wall portion 55 provided in carrier tape holding device 25 from below, tape roll body 24 does not come out upward from storage space 57.

Figure 11:
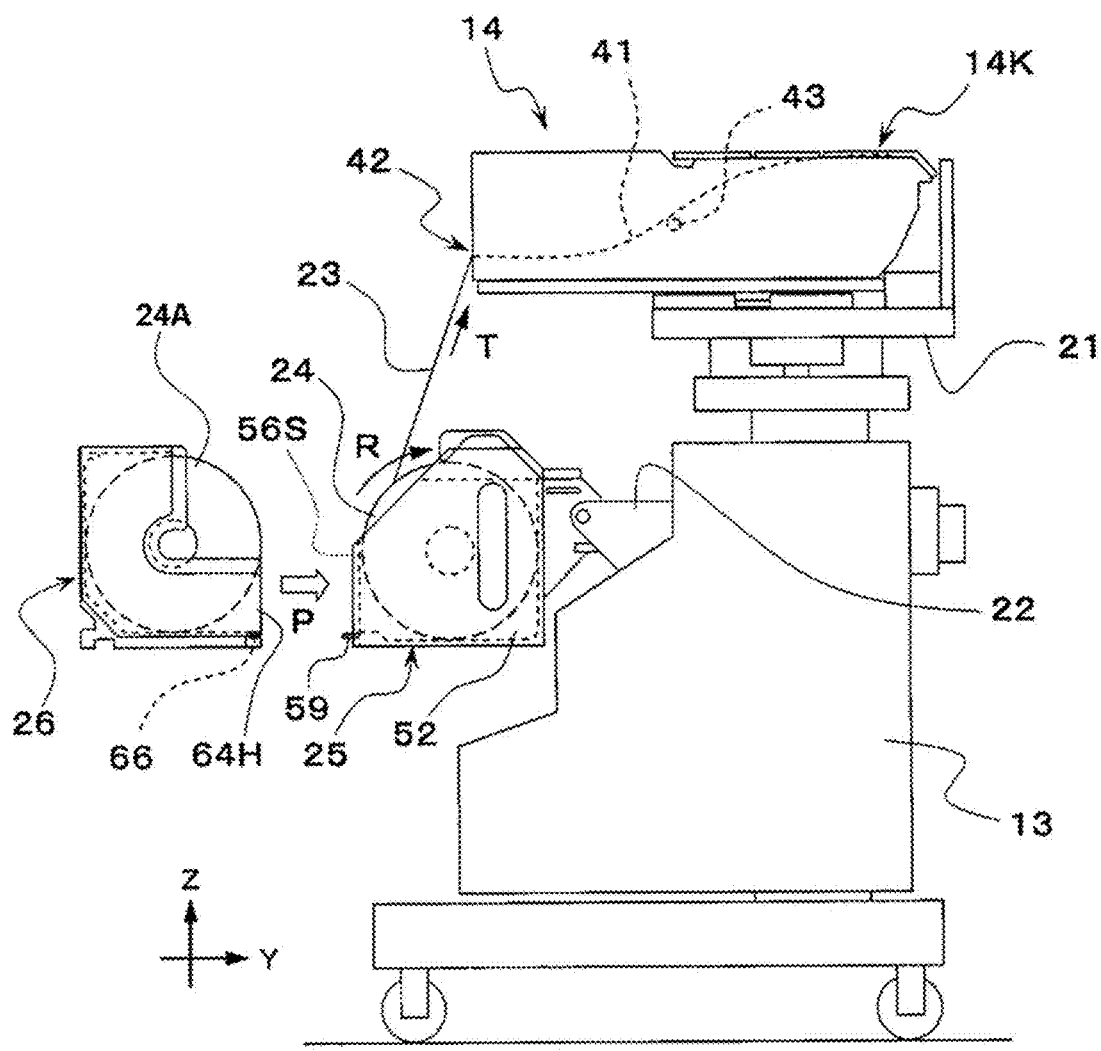
FIG. 11 is a side view illustrating the carrier tape holding device and the carriage illustrated in FIG. 8 together with the holder illustrated in FIG. 6A.
Figure 12A:
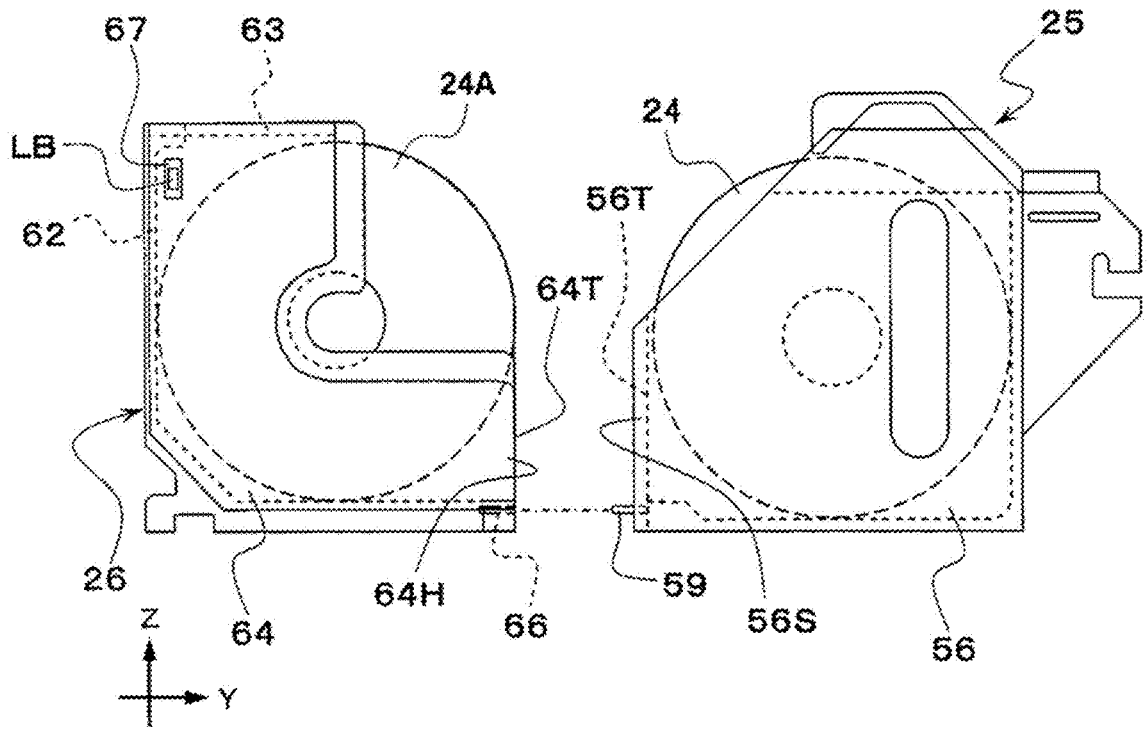
FIG. 12A is a diagram for describing a procedure for attaching the holder illustrated in FIG. 6A to the carrier tape holding device illustrated in FIG. 4A.
Figure 12B:
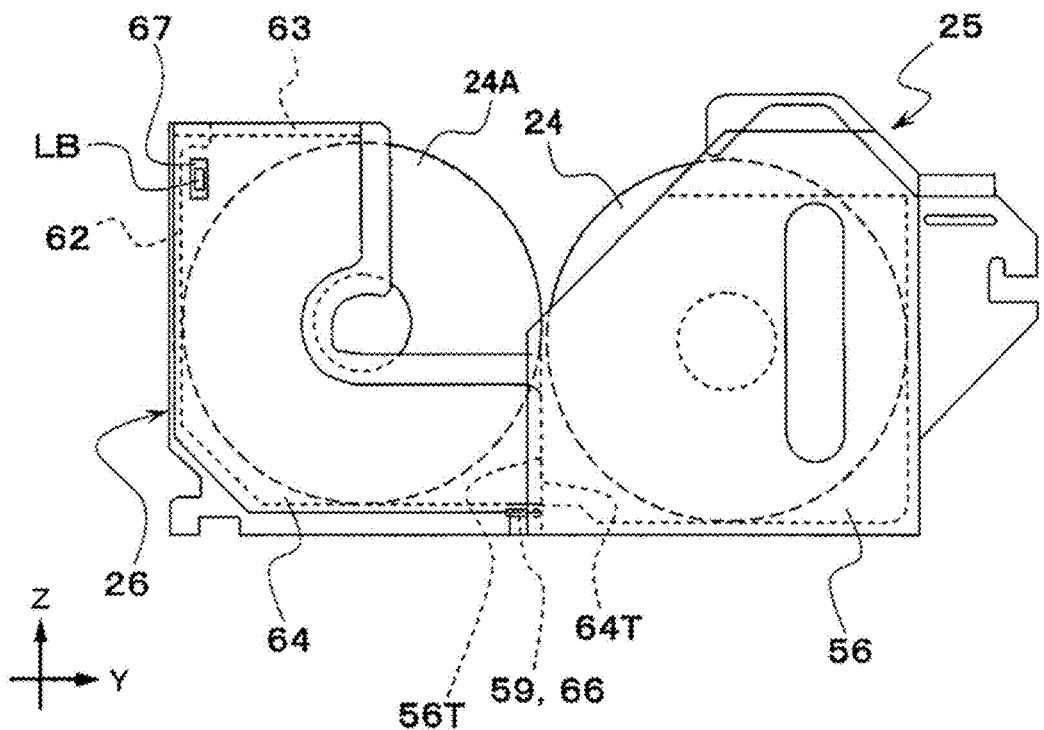
FIG. 12B is a diagram for describing a procedure subsequent to FIG. 12A.

When holder 26 storing tape roll body 24 is attached to carrier tape holding device 25, in FIG. 11, operator OP brings holder 26 close to carrier tape holding device 25 from the rear as indicated by arrow P. Then, as illustrated in FIGS. 12A and 12B, operator OP fits alignment projection 59 of carrier tape holding device 25 into fitting hole 66 of holder 26. Then, operator OP brings front end surfaces 64T of front end portions of the pair of side wall portions 64 into contact with contact surfaces 56T provided inside rear end portions of the pair of side wall portions 56 of carrier tape holding device 25 from the rear. The rear end portions of the pair of side wall portions 56 are holder mounting portion 56S, and the front end portions of the pair of side wall portions 64 are mounting portion 64H. That is, storage portion 52 includes holder mounting portion 56S. In this manner, operator OP couples (interlocks) mounting portion 64H to holder mounting portion 56S.

Figure 13:
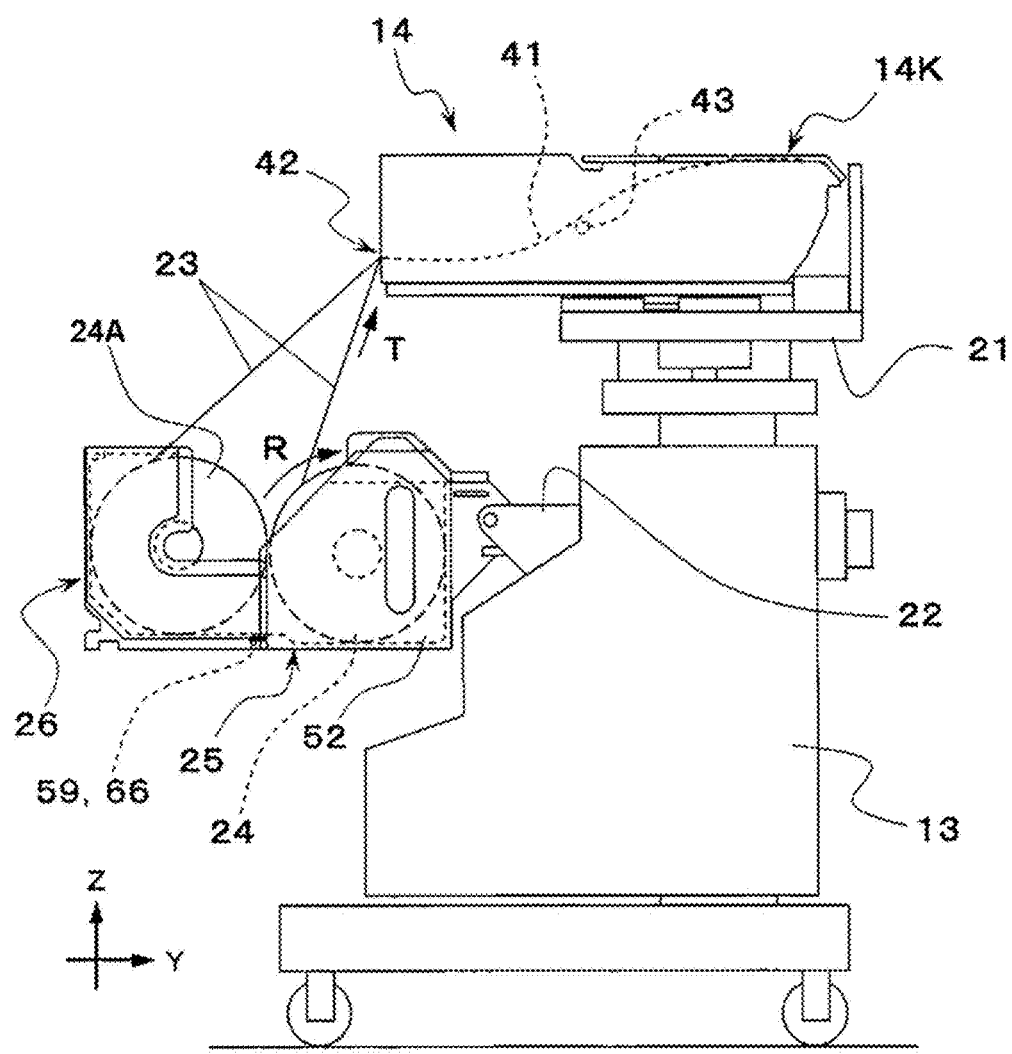
FIG. 13 is a side view illustrating a state in which the holder is attached to the carrier tape holding device subsequent to the state illustrated in FIG. 11.

Holder 26 and carrier tape holding device 25 are coupled as described above, so that holder 26 and carrier tape holding device 25 are coupled with the central axes thereof coinciding with each other as illustrated in FIGS. 12B and 13. Additionally, holder 26 is mounted on holder mounting portion 56S with opening 65K facing storage portion 52. When holder 26 is attached to carrier tape holding device 25, operator OP pulls out carrier tape 23 from tape roll body for replenishment 24A stored in storage space 65 of holder 26. Then, as illustrated in FIG. 13, operator OP inserts the head portion of carrier tape 23 of tape roll body for replenishment 24A into tape insertion port 42 of component supply unit 14.

Figure 14:
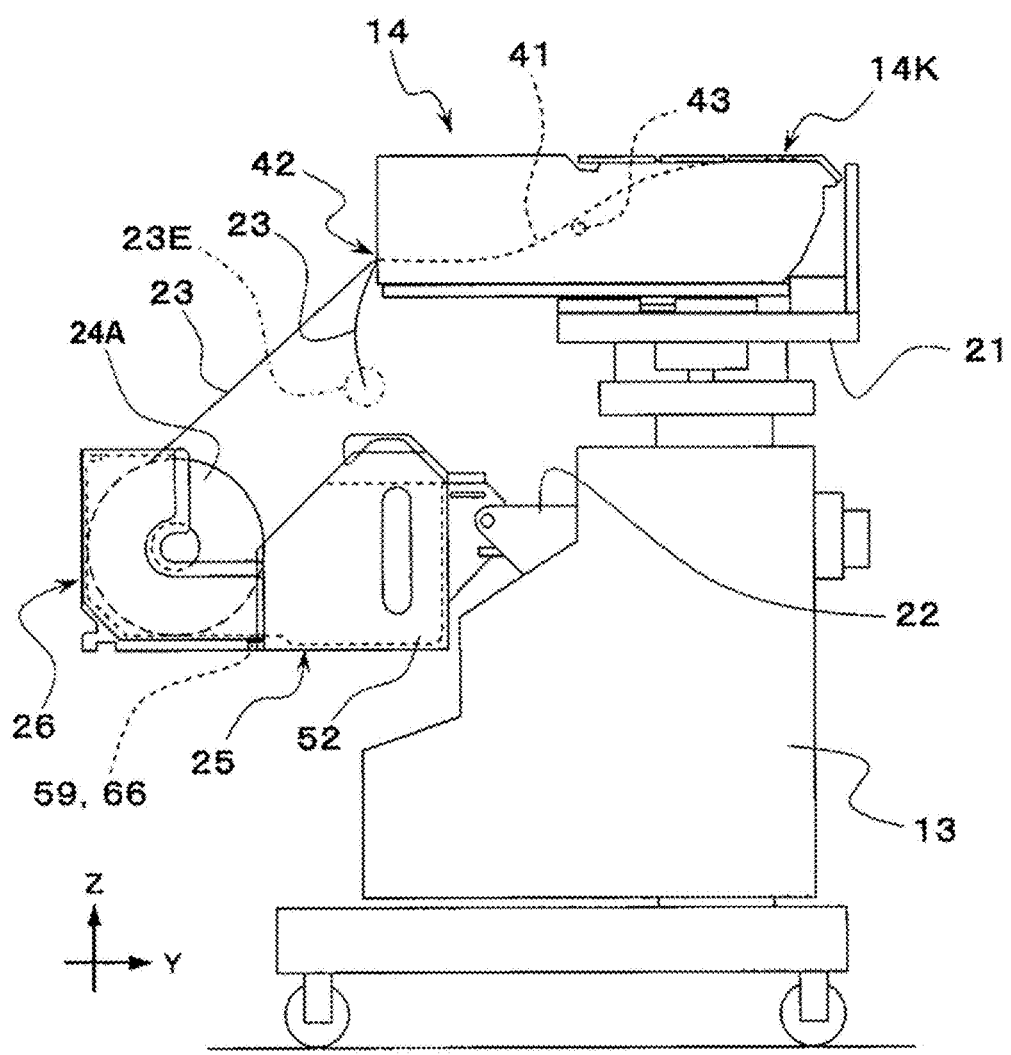
FIG. 14 is a side view illustrating a state in which the entire carrier tape is pulled out from the tape roll body held by the carrier tape holding device subsequent to the state illustrated in FIG. 13.

When the supply of components BH by component supply unit 14 progresses and the pulling out of carrier tape 23 of tape roll body 24 held by carrier tape holding device 25 is completed, end portion 23E of carrier tape 23 comes out upward from storage portion 52 as illustrated in FIG. 14. Since tape roll body 24 is coreless, nothing remains in storage portion 52 of carrier tape holding device 25 after end portion 23E is pulled out upward from storage portion 52 by component supply unit 14, and storage portion 52 becomes empty.

After end portion 23E comes out upward from storage portion 52, end portion 23E is detected by end portion detection sensor 43 provided in component supply unit 14. When end portion detection sensor 43 detects end portion 23E, component supply unit 14 starts drawing the subsequent carrier tape 23. That is, component supply unit 14 starts to draw carrier tape 23 which is pulled out from tape roll body for replenishment 24A stored in holder 26 and whose head portion is inserted into tape insertion port 42.

Figure 15:
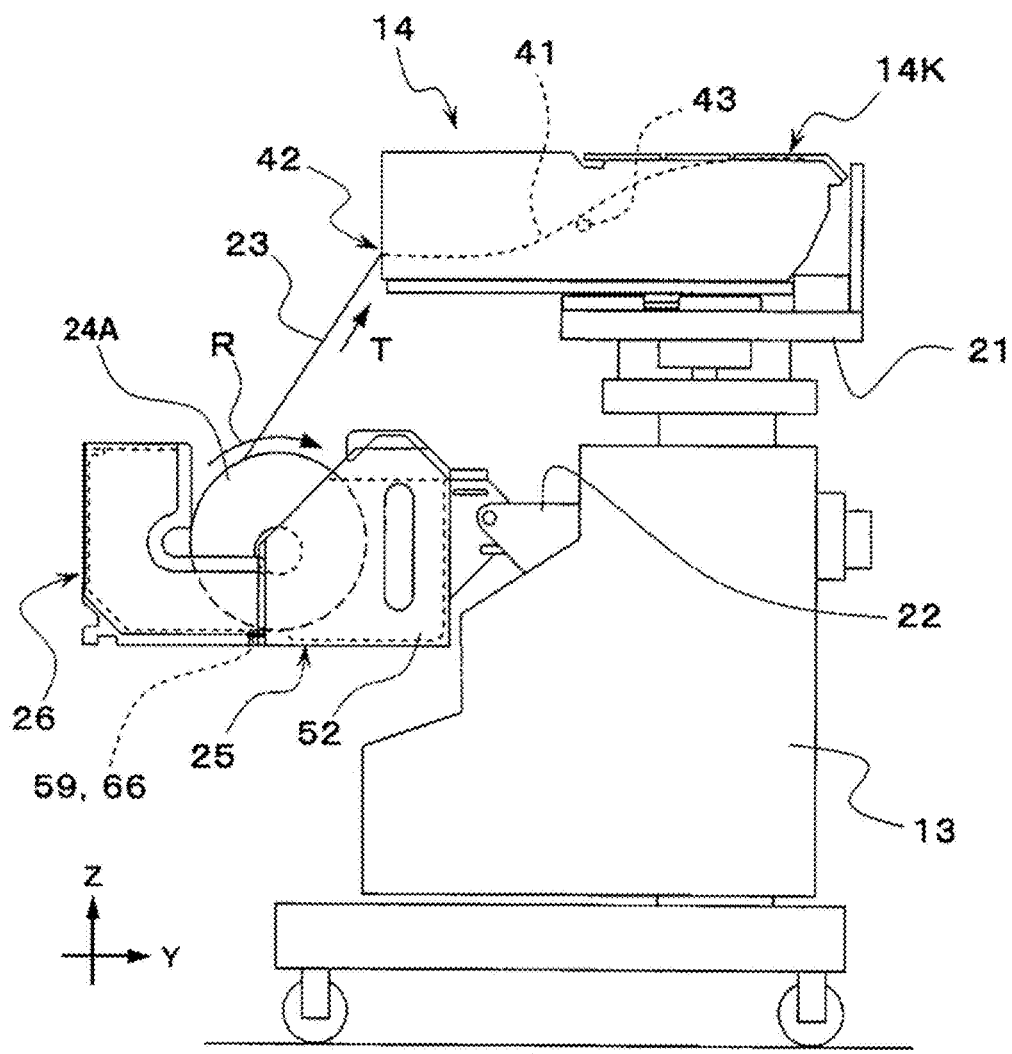
FIG. 15 is a side view illustrating a state in which the tape roll body for replenishment starts to roll from the holder toward the carrier tape holding device subsequent to the state illustrated in FIG. 14.
Figure 16:
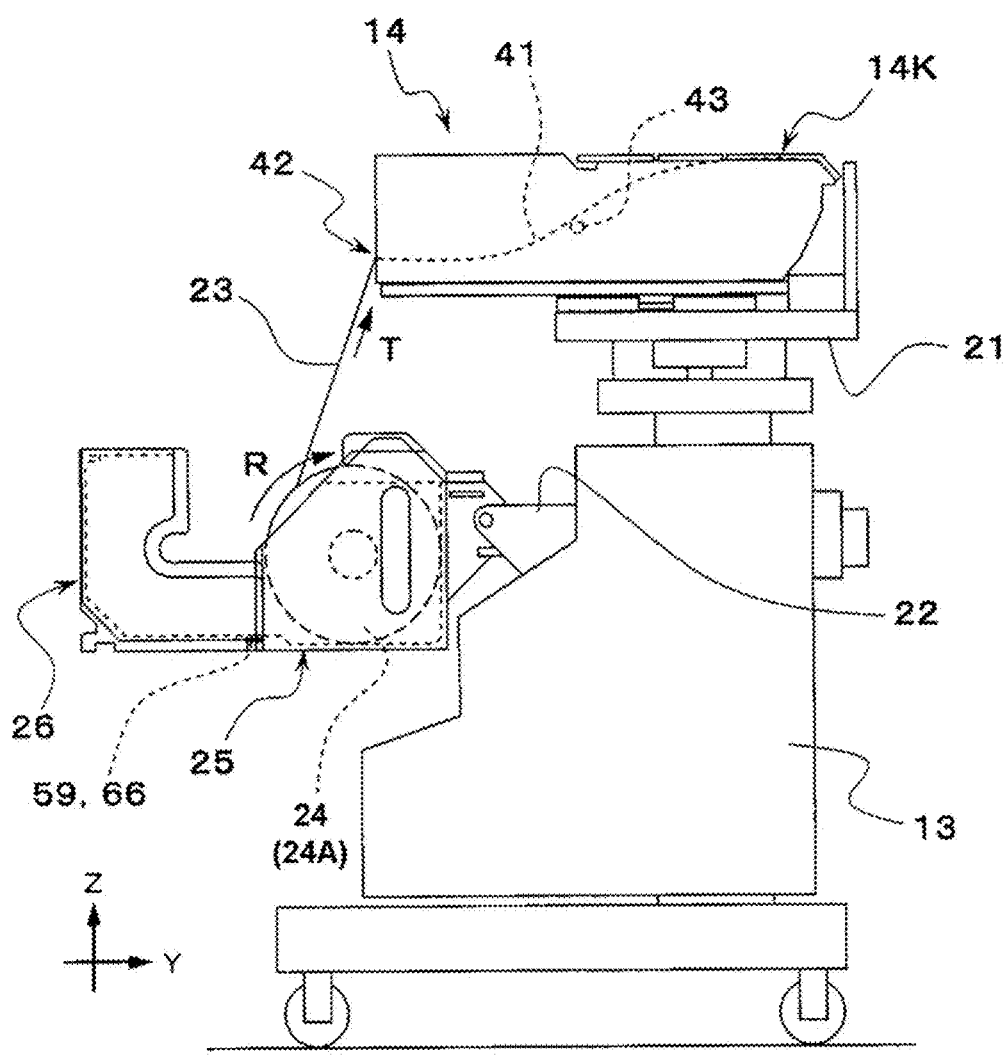
FIG. 16 is a side view illustrating a state in which the tape roll body for replenishment is transferred from the holder to the carrier tape holding device, subsequent to the state illustrated in FIG. 15.

When component supply unit 14 starts to draw the subsequent carrier tape 23, tape roll body for replenishment 24A stored in holder 26 rotates as indicated by arrow R as carrier tape 23 is pulled out by component supply unit 14 as illustrated in FIG. 15. Tape roll body for replenishment 24A rolls in holder 26 (in storage space 65) by the rotation, and moves into storage portion 52 (into storage space 57) of carrier tape holding device 25 as illustrated in FIGS. 15 and 16. When moving to storage portion 52, tape roll body for replenishment 24A climbs over sill portion 58 provided in the rear end portion of bottom portion 53 of carrier tape holding device 25. Hence, tape roll body for replenishment 24A having moved into storage portion 52 cannot easily come out rearward from storage space 57.

As described above, carrier tape holding device 25 stores tape roll body 24, and has storage portion 52 that allows carrier tape 23 to be pulled out from tape roll body 24 by component supply unit 14. Then, storage portion 52 holds tape roll body 24 in a state where component supply unit 14 can draw carrier tape 23 from tape roll body 24. Additionally, holder 26 storing tape roll body for replenishment 24A can be detachably mounted on storage portion 52. Storage portion 52 can receive tape roll body 24 moved from holder 26 with holder 26 mounted on storage portion 52. Additionally, tape roll body for replenishment 24A stored in holder 26 mounted on carrier tape holding device 25 is rotated by carrier tape 23 being pulled out by component supply unit 14. Due to the rotation, tape roll body for replenishment 24A rolls in holder 26 and moves to storage space 57 of storage portion 52 of carrier tape holding device 25. Thereafter, tape roll body for replenishment 24A is used as a new tape roll body 24.

Figure 17:
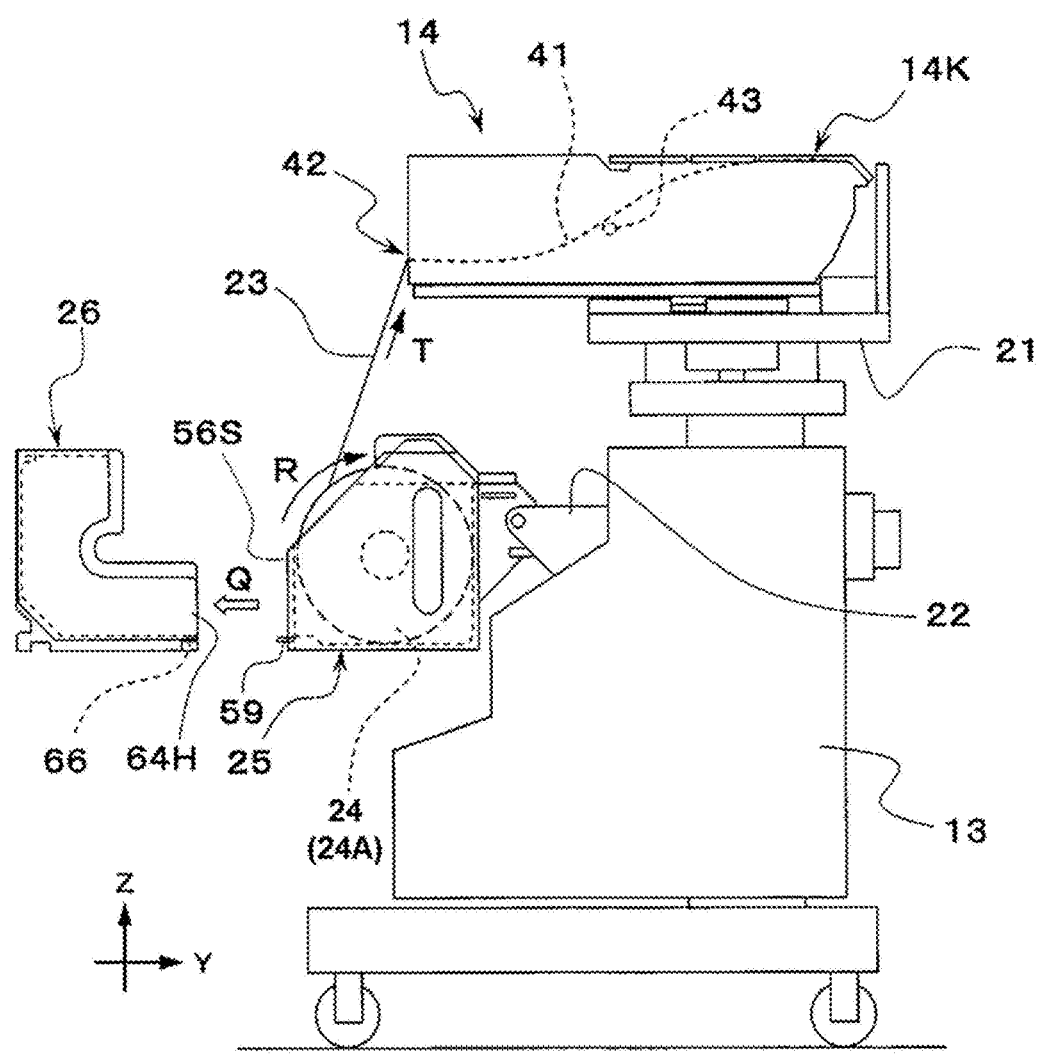
FIG. 17 is a side view illustrating a state in which the tape roll body for replenishment transferred to the carrier tape holding device is used as a new tape roll body and the entire carrier tape is pulled out, subsequent to the state illustrated in FIG. 16.

When tape roll body for replenishment 24A in holder 26 moves to storage portion 52 of carrier tape holding device 25, operator OP removes the empty holder 26 from carrier tape holding device 25 as indicated by arrow Q as illustrated in FIG. 17. Then, returning to the state of FIG. 11, as indicated by arrow P, holder 26 storing the new tape roll body for replenishment 24A is attached to carrier tape holding device 25.

Hereinafter, operator OP repeats the work illustrated in FIGS. 13 to 17. In this manner, the supply of components BH by component supply unit 14 can be continued while replenishing tape roll body 24.

Figure 18:
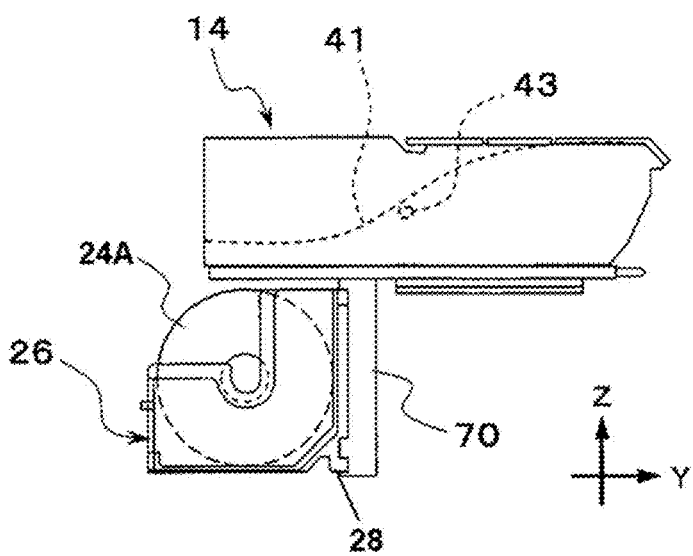
FIG. 18 is a side view of the component supply unit illustrating a state in which the holder illustrated in FIG. 6A is attached to a case attaching member mounted on the component supply unit.

FIG. 18 illustrates a state in which holder 26 is temporarily attached to holder attaching member 70 mounted on component supply unit 14. As described above, holder 26 has attachment portion 28, and can be attached to holder attaching member 70 mounted on component supply unit 14. For example, when it is necessary to detach component supply unit 14 in use from carriage 13, operator OP moves tape roll body 24 in carrier tape holding device 25 to holder 26 after mounting the empty holder 26 on carrier tape holding device 25. Then, operator OP detaches component supply unit 14 from unit attachment base 21 and also detaches holder 26 from carrier tape holding device 25. Further, operator OP attaches holder 26 to holder attaching member 70 mounted on component supply unit 14 by attachment portion 28.

As a result, component supply unit 14 and carrier tape 23 (tape roll body 24) can be moved or stored as a set without detaching carrier tape 23 attached to component supply unit 14 from component supply unit 14. In this case, in order to prevent tape roll body 24 from falling off storage space 65, operator OP attaches holder 26 to holder attaching member 70 with opening 65K facing upward. Note that while an example in which holder 26 is attached to holder attaching member 70 mounted on component supply unit 14 has been described herein, an attachment portion that can be attached directly to component supply unit 14 may be provided in holder 26. In this case, holder attaching member 70 is unnecessary, and operator OP directly attaches holder 26 to component supply unit 14.

Figure 19:
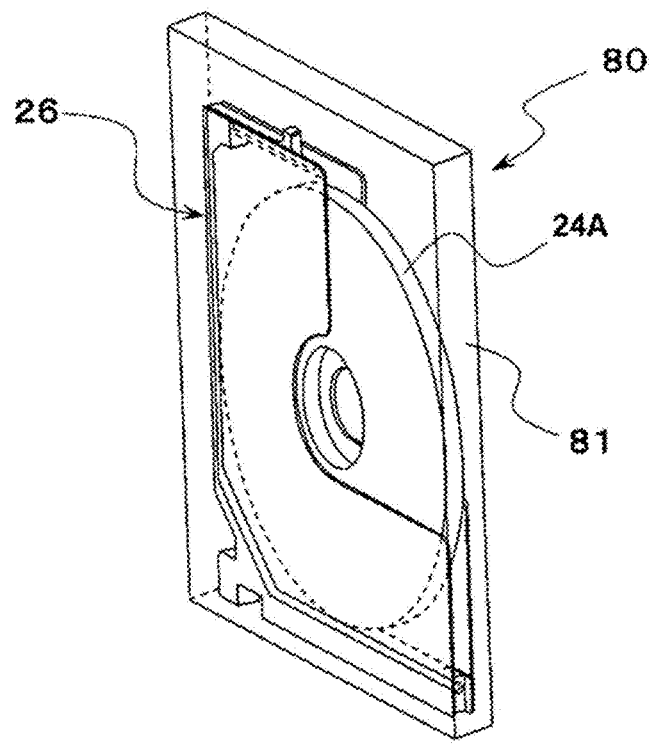
FIG. 19 is a perspective view illustrating an example of a carrier tape package body of the exemplary embodiment of the present invention.

FIG. 19 is a perspective view illustrating carrier tape package body 80. Carrier tape package body 80 is formed by storing tape roll body for replenishment 24A in holder 26 and then packaging holder 26 with package member 81. Package member 81 may be a bag member (vinyl bag or the like) in addition to the box member. As a result, tape roll body for replenishment 24A can be integrated with holder 26 for distribution. When setting carrier tape 23 in component supply unit 14, operator OP can easily replenish carrier tape 23 only by taking out holder 26 storing tape roll body for replenishment 24A from package member 81 and attaching the taken-out holder 26 to carrier tape holding device 25.

In such carrier tape package body 80, the above-described information carrier LB can be adhered to holder 26 in advance. In this case, operator OP does not need to separate information carrier LB from tape roll body 24 and adhere information carrier LB to information carrier attachment region 67 of holder 26. When information carrier LB is attached to package member 81 instead of holder 26, tape roll body 24 and holder 26 are taken out from package member 81, and then information carrier LB is removed from package member 81 and attached to information carrier attachment region 67 of holder 26.

As described above, in carrier tape holding device 25, storage portion 52 that stores tape roll body 24 holds tape roll body 24 so that component supply unit 14 can draw carrier tape 23 from tape roll body 24. Additionally, carrier tape holding device 25 is capable of receiving tape roll body for replenishment 24A moved from holder 26 with holder 26 storing tape roll body for replenishment 24A detachably attached to carrier tape holding device 25. Hence, when tape roll body 24 is replenished (i.e., replenished with carrier tape 23), holder 26 storing tape roll body for replenishment 24A only needs to be mounted on carrier tape holding device 25. Holder 26 can have a simple configuration, can be manufactured at low cost, can be reused, and can be transported and stored with tape roll body for replenishment 24A stored in holder 26. Hence, the cost required for replenishment of components BH can be reduced significantly. For this reason, according to the present exemplary embodiment, components can be supplied to component supply unit 14 with a simple and inexpensive configuration.

Although the exemplary embodiment of the present invention has been described above, the present invention is not limited to the above exemplary embodiment, and various modifications and the like can be made. For example, the shapes of carrier tape holding device 25 and holder 26 illustrated in the above-described exemplary embodiment are merely examples, and are not limited to those illustrated in the exemplary embodiment. In particular, holder 26 may have a shape other than the case shape. Holder 26 only needs to have a structure that does not prevent the held tape roll body for replenishment 24A from rolling and moving to storage portion 52 when carrier tape 23 is drawn by component supply unit 14.

Additionally, multiple tape roll bodies 24 may be arranged and stored in carrier tape holding device 25. In this case, a partition plate that partitions tape roll bodies 24 adjacent to each other is preferably provided in carrier tape holding device 25. Additionally, when multiple tape roll bodies 24 can be arranged and stored in carrier tape holding device 25, it is preferable that multiple holders 26 be arranged and attached to carrier tape holding device 25.

Additionally, while carrier tape holding device 25 is attached to carriage 13 in the example of the present exemplary embodiment, carrier tape holding device 25 may be provided in component supply unit 14. Further, while mounting portion 64H of holder 26 is mounted on holder mounting portion 56S of storage portion 52 in the example of the present exemplary embodiment, the holder mounting portion may be provided in another part of storage portion 52. That is, the holder mounting portion may be provided in a suitable position in carrier tape holding device 25, and tape roll body for replenishment 24A may be changed so as to move to storage portion 52 from holder 26 mounted on the holder mounting portion. Further, while tape roll body 24 having no winding core is used in the example of the present exemplary embodiment, the use of a tape roll body having a winding core or a tape roll body wound around a reel is not excluded.

INDUSTRIAL APPLICABILITY

Provided are a carrier tape holding device, a holder, and a carrier tape package body capable of replenishing a component supply unit with components with a simple and inexpensive configuration.

REFERENCE MARKS IN THE DRAWINGS 1 component mounting device
11 base
12 substrate conveyance unit
12a conveyor mechanism
13 carriage
14 component supply unit
14K component extraction position
15 mounting head
15N nozzle
16 head moving mechanism
21 unit attachment base
22 bracket
22P locking pin
22S detent
23 carrier tape
23E end portion
23H engagement hole
23P pocket
24 tape roll body
24A tape roll body for replenishment
25 carrier tape holding device
26 holder
27 holding portion
28 attachment portion
31 base tape
32 cover tape
41 conveyance path
42 tape insertion port
43 end portion detection sensor
51 coupling portion
51F hook portion
52 storage portion
53, 61 bottom portion
54 front wall portion
55, 63 upper wall portion
56, 64 side wall portion
56S holder mounting portion
56T contact surface
57,65 storage space
57K opening
58 sill portion
59 alignment projection
62 rear wall portion
64H mounting portion
64T front end surface
65K opening
66 fitting hole
67 information carrier attachment region
70 holder attaching member
80 carrier tape package body
81 package member
CTR controller
BH component
LB information carrier

The invention claimed is:

1. A component mounting device comprising:
a mounting head being configured to mount a component from a carrier tape onto a substrate,
a component supply unit being configured to convey the carrier tape,
a holder, and
a carrier tape holding device providing a first storage space in communication with the holder, the carrier tape holding device being configured to perform operations comprising:
holding the carrier tape that, when conveyed by the component supply unit, is pulled out from a tape roll body stored in the first storage space,
having a tape roll body for replenishment stored in the holder; and
receiving the tape roll body for replenishment from the holder when the carrier tape of the tape roll body for replenishment is conveyed by the component supply unit.

2. The component mounting device according to claim 1, wherein
the tape roll body formed by winding the carrier tape in roll shape with no core.

3. The component mounting device according to claim 1, wherein
the holder has a case shape and includes a second storage space and an opening, the second storage space being for storing the tape roll body for replenishment, the opening being for taking in and out the tape roll body for replenishment to and from the second storage space.

4. The component mounting device according to claim 1, wherein
the carrier tape holding device includes:
a bottom portion that supports the tape roll body from below, and
a pair of side wall portions rising from both sides of the bottom portion; and
the bottom portion and the pair of side wall portions form the first storage space.

5. A method for operating a component mounting device comprising:
a mounting head being configured to mount a component from a carrier tape onto a substrate,
a component supply unit being configured to convey the carrier tape,
a holder, and
a carrier tape holding device providing a storage space in communication with the holder,
the method comprising:
holding the carrier tape that, when conveyed by the component supply unit, is pulled out from a tape roll body stored in the storage space;
having a tape roll body for replenishment stored in the holder; and
receiving the tape roll body for replenishment from the holder when the carrier tape of the tape roll body for replenishment is conveyed by the component supply unit.

* * * * *